(12) United States Patent
Tsai et al.

(10) Patent No.: US 12,046,661 B2
(45) Date of Patent: *Jul. 23, 2024

(54) FIN-TYPE FIELD EFFECT TRANSISTOR

(71) Applicant: Taiwan Semiconductor Manufacturing Company, Ltd., Hsinchu (TW)

(72) Inventors: Chun Hsiung Tsai, Hsinchu County (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 555 days.

This patent is subject to a terminal disclaimer.

(21) Appl. No.: 17/200,905

(22) Filed: Mar. 15, 2021

(65) Prior Publication Data

US 2021/0202718 A1 Jul. 1, 2021

Related U.S. Application Data

(60) Continuation of application No. 16/132,453, filed on Sep. 16, 2018, now Pat. No. 10,950,710, which is a division of application No. 15/145,804, filed on May 4, 2016, now Pat. No. 10,079,291.

(51) Int. Cl.
*H01L 29/66* (2006.01)
*H01L 29/06* (2006.01)
*H01L 29/78* (2006.01)

(52) U.S. Cl.
CPC .... *H01L 29/66553* (2013.01); *H01L 29/0649* (2013.01); *H01L 29/66795* (2013.01); *H01L 29/785* (2013.01)

(58) Field of Classification Search
CPC ......... H01L 29/66553; H01L 29/41783; H01L 21/823418; H01L 21/823814; H01L 29/66795; H01L 29/785
See application file for complete search history.

(56) References Cited

U.S. PATENT DOCUMENTS

| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |

(Continued)

FOREIGN PATENT DOCUMENTS

CN 105322013 2/2016

OTHER PUBLICATIONS

Office Action of China Counterpart Application, issued on Jul. 6, 2021, pp. 1-21.

*Primary Examiner* — Shahed Ahmed
*Assistant Examiner* — Sun Mi Kim King
(74) *Attorney, Agent, or Firm* — JCIPRNET

(57) ABSTRACT

A fin-type field effect transistor including a substrate, insulators, a gate stack, a first spacer, a second spacer, and a third spacer is described. The substrate has fins thereon. The insulators are located over the substrate and between the fins. The gate stack is located over the fins and over the insulators. The first spacer is located over the sidewall of the gate stack. The second spacer is located over the first spacer. The first spacer and the second spacer includes carbon. The third spacer is located between the first spacer and the second spacer.

20 Claims, 14 Drawing Sheets

(56) References Cited

U.S. PATENT DOCUMENTS

| | | | |
|---|---|---|---|
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 10,950,710 B2 * | 3/2021 | Tsai | H01L 29/66553 |
| 2014/0073097 A1 | 3/2014 | Chung et al. | |
| 2017/0133274 A1 * | 5/2017 | Lu | H01L 21/02167 |

* cited by examiner

FIN-TYPE FIELD EFFECT TRANSISTOR

CROSS-REFERENCE TO RELATED APPLICATION

This application is a continuation application of and claims the priority benefit of a prior application Ser. No. 16/132,453, filed on Sep. 16, 2018, now allowed. The prior application is a divisional application of and claims the priority benefit of U.S. application Ser. No. 15/145,804, filed on May 4, 2016. The entirety of each of the above-mentioned patent applications is hereby incorporated by reference herein and made a part of this specification.

BACKGROUND

As semiconductor devices keep scaling down in size, three-dimensional multi-gate structures, such as the fin-type field effect transistor (FinFET), have been developed to replace planar CMOS devices. A structural feature of the FinFET is the silicon-based fin that extends upright from the surface of the substrate, and the gate wrapping around the channel further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
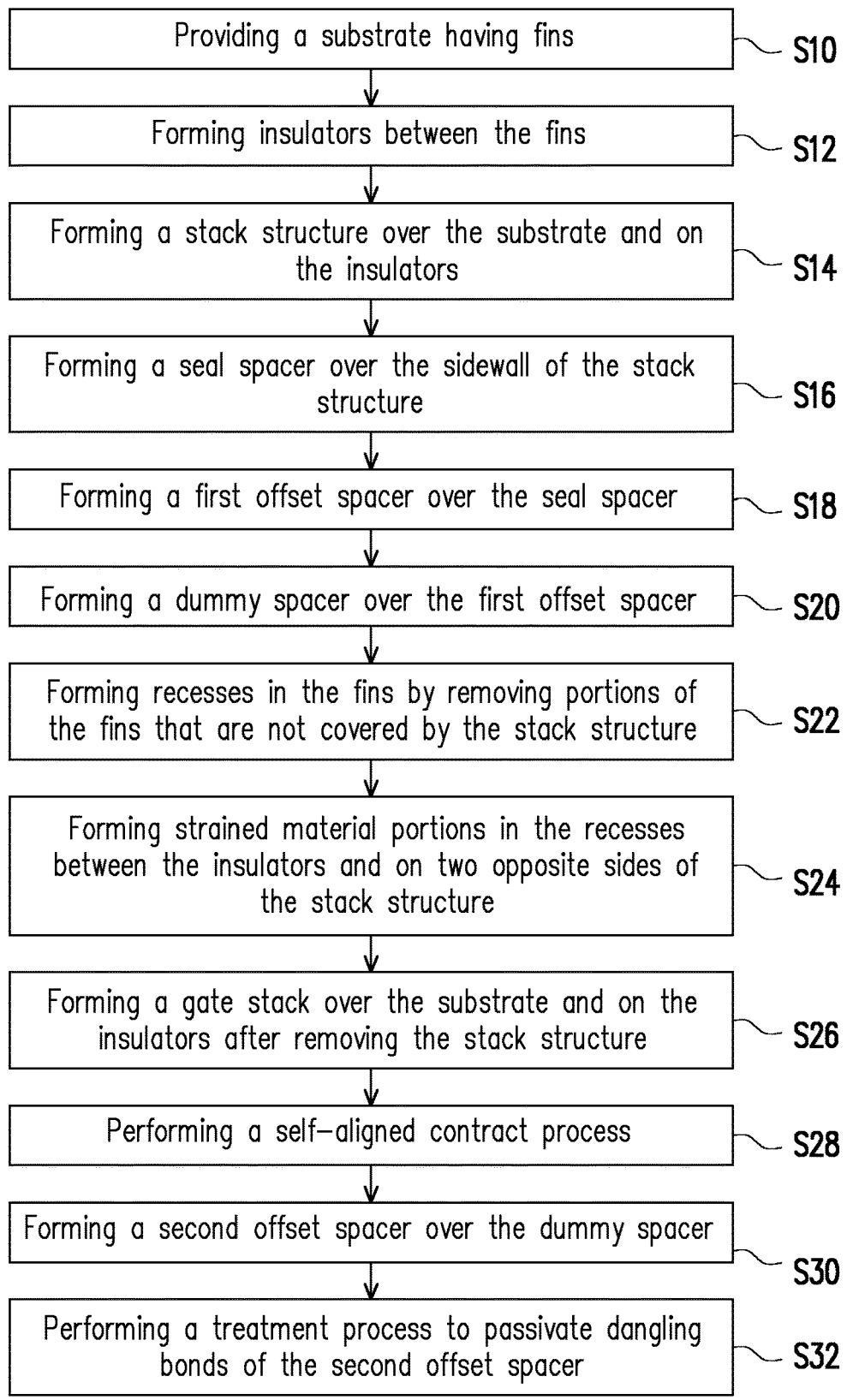
FIG. 1 is an exemplary flow chart showing the process steps of the manufacturing method for forming a FinFET in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the present disclosure describe the exemplary manufacturing processes of FinFETs and the FinFETs fabricated therefrom. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not used to limit the contexts.

In accordance with the embodiments, FIG. 1 is an exemplary flow chart showing the process steps of the manufacturing method for forming a FinFET. The various process steps of the process flow illustrated in FIG. 1 may include multiple process steps as discussed below. FIGS. 2A-2G are perspective views showing the FinFET 200 at various stages of the manufacturing method for forming the FinFET according to some embodiments of the present disclosure. FIGS. 3A-3G are cross-sectional views of the FinFET 200 taken along the line I-I' of FIGS. 2A-2G respectively. It is to be noted that the process steps described herein cover a portion of the manufacturing processes used to fabricate a FinFET device.

Figure 2A:
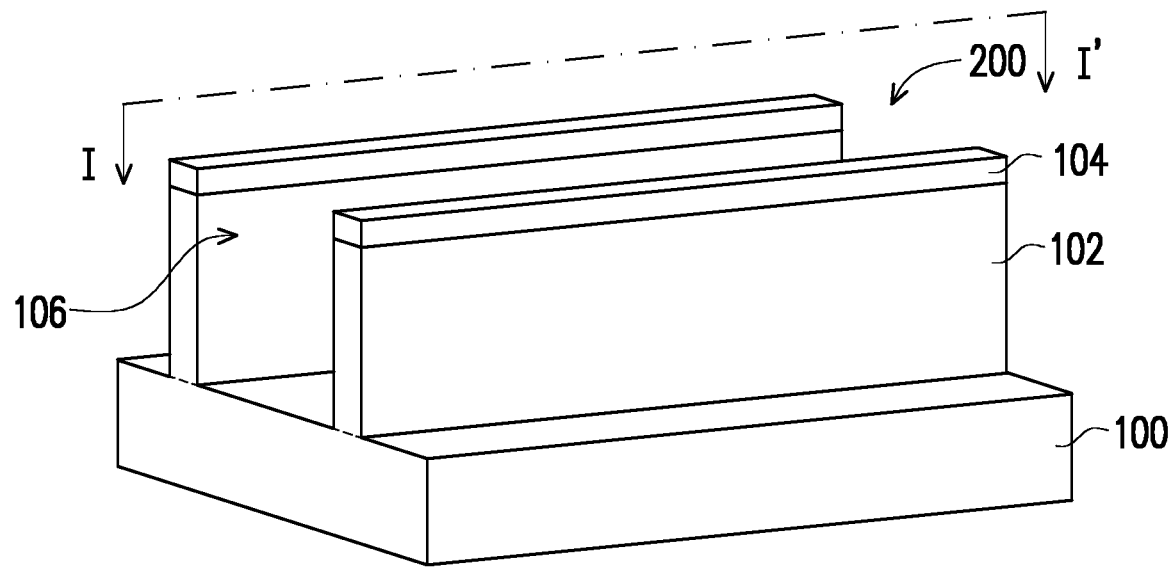
FIGS. 2A-2I are perspective views showing the FinFET at various stages of the manufacturing method according to some embodiments of the present disclosure.
Figure 3A:
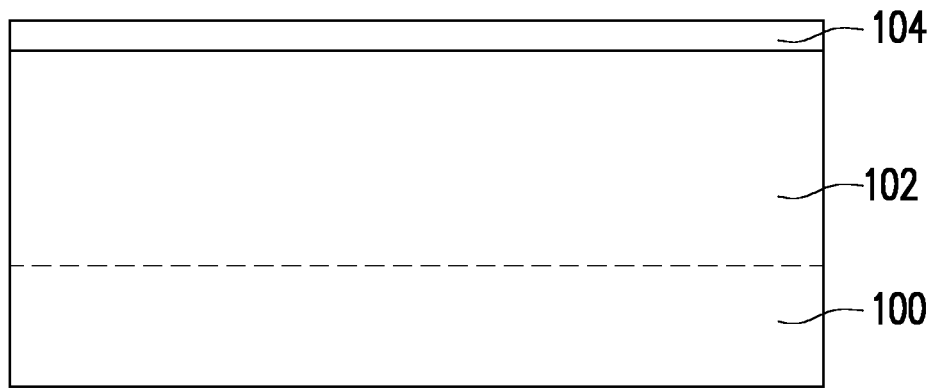
FIGS. 3A-3I are cross-sectional views showing the FinFET at various stages of the manufacturing method according to some embodiments of the present disclosure.

FIG. 2A is a perspective view of the FinFET 200 at one of various stages of the manufacturing method, and FIG. 3A is a cross-sectional view of the FinFET 200 taken along the line I-I' of FIG. 2A. In Step 10 and as shown in FIGS. 2A and 3A, a substrate 100 having fins 102 thereon is provided. In some embodiments, the substrate 100 is a bulk silicon substrate. Depending on the requirements of design, the substrate 100 may be a p-type substrate or an n-type substrate and include different doped regions. The doped regions may be configured for an n-type FinFET or a p-type FinFET. In some embodiments, the substrate 100 having the fins 102 thereon is formed by the following steps: forming a mask layer 104 over the substrate 100; forming a photosensitive pattern on the mask layer 104 and over the substrate 100; patterning the substrate 100 to form trenches 106 in the substrate 100 and forming the fins 102 between the trenches 106 by etching into the substrate 100, using the photosensitive pattern and the mask layer 104 as etching masks. In some embodiments, the mask layer 104 is a silicon nitride layer formed by, for example, chemical vapor deposition (CVD). In some embodiments, the trenches 106 are strip-shaped and arranged in parallel.

Figure 2B:
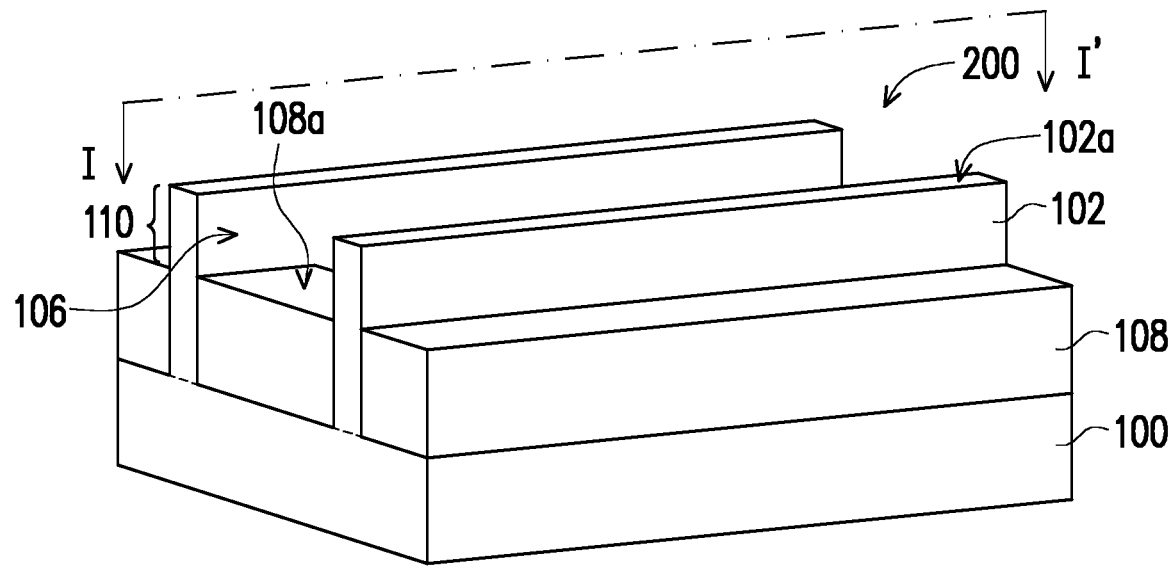
Figure 3B:
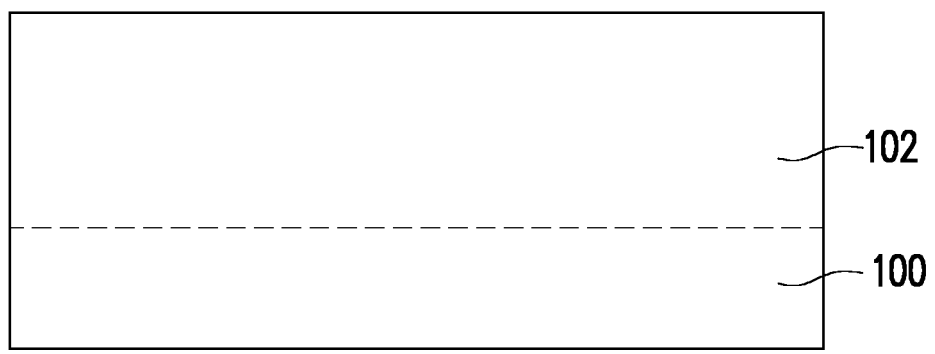

FIG. 2B is a perspective view of the FinFET 200 at one of various stages of the manufacturing method, and FIG. 3B is a cross-sectional view of the FinFET 200 taken along the line I-I' of FIG. 2B. In Step 12, insulators 108 are formed between the fins 102. The trenches 106 are filled with an insulating material (not shown). In some embodiments, the insulating material includes silicon oxide, silicon nitride, silicon oxynitride, a spin-on dielectric material, or a low-k dielectric material. The insulating material is formed by high-density-plasma chemical vapor deposition (HDP-CVD), sub-atmospheric CVD (SACVD) or by spin-on. Optionally, a chemical mechanical polish process is performed to remove the projected insulating material and the remaining mask layer 104 (referring to FIG. 2A). Afterwards, the insulating material filled in the trenches 106 between the fins 102 is partially removed by an etching process. In some embodiments, the etching process is performed by using a wet etching process with hydrofluoric acid (HF). In another embodiment, the etching process is performed by using a dry etching process. The insulating material remaining in the trenches 106 becomes the insulators 108 with top surfaces 108a lower than the top surfaces 102a of the fins 102. Upper portions 110 of the fins 102 protrude from the top surfaces 108a of the insulators 108.

Figure 2C:
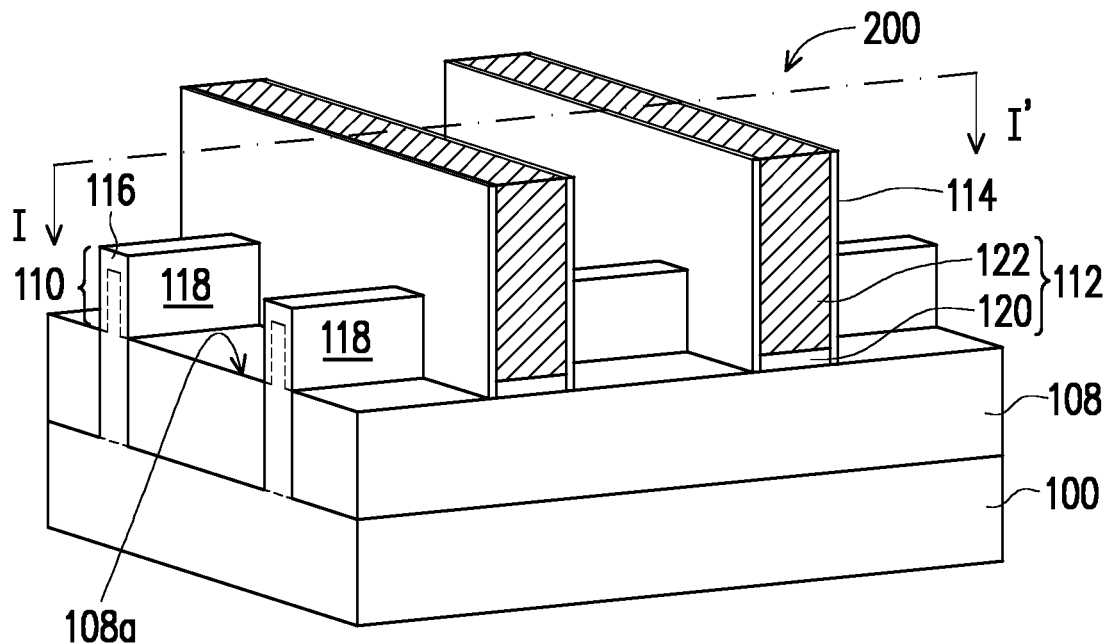
Figure 3C:
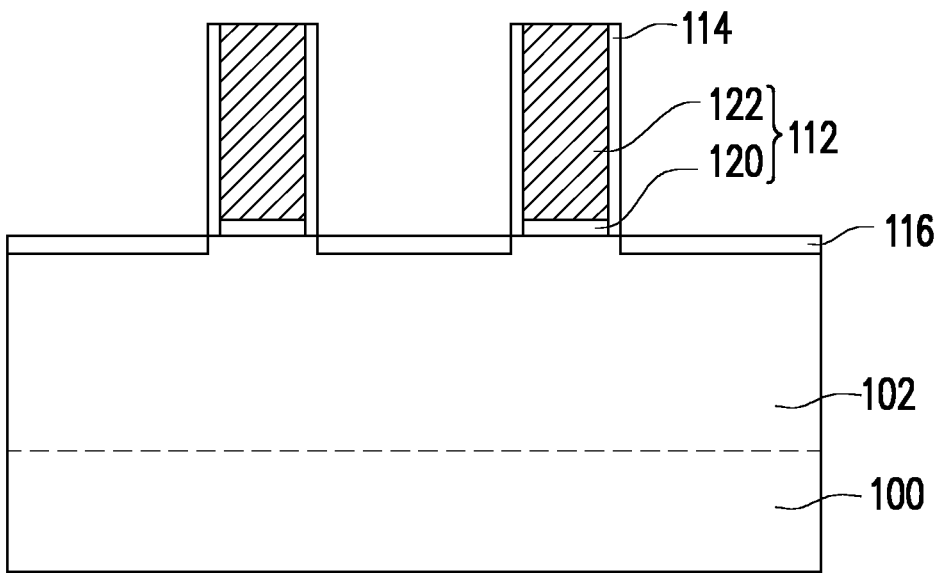

FIG. 2C is a perspective view of the FinFET 200 at one of various stages of the manufacturing method, and FIG. 3C is a cross-sectional view of the FinFET 200 taken along the line I-I' of FIG. 2C. In Step 14, a stack structure 112 is formed over the substrate 100 and on the insulators 108, and across and over the upper portions 110 of the fins 102. In FIG. 2C, two stack structures 112 are shown. The number of the stack structures 112 shown here is for illustrative purposes and is not intended to limit the structure of the present disclosure. The stack structures 112 are arranged in parallel. The stack structure 112 includes a dielectric layer 120 and a polysilicon strip 122 located over the dielectric layer 120. In some embodiments, one of the stack structures 112 covers the upper portions 110 of the fins 102. In some embodiments, the stack structure 112 is formed by depositing an oxide layer (not shown), depositing a polysilicon layer (not shown) over the oxide layer, and then patterning the polysilicon layer to form the polysilicon strip 122 and the dielectric layer 120.

In Step 16, a seal spacer 114 is formed over the sidewall of the stack structure 112 (the polysilicon strip 122). In some embodiments, the seal spacer 114 is formed of dielectric materials, such as silicon carbide nitride (SiCN), silicon-carbon-oxy-nitride (SiCON) or a combination thereof. In some embodiments, the seal spacer 114 has a thickness of 1-2 nm over the polysilicon strip and has a dielectric constant of 4-7. In some embodiments, the seal spacer 114 is formed by depositing a blanket layer of a dielectric material by atomic layer deposition (ALD) and performing an anisotropic etching process to form the seal spacer 114 on both sides of the stack structure 112. In some embodiments, the seal spacer 114 is formed of SiCN with a carbon concentration of 1-12 at % (atomic percent) to retain needed etching selectivity and a dielectric constant of 4-7. The ALD SiCN with carbon doped improves the needed etching selectivity for the stack structure 112 (the polysilicon strip 122). Thus, the inside-out gate to contact or gate to source and drain short risk is eliminated. The stack structure 112 overlaps with and covers portions of the upper portions 110 of the fins 102 and the covered portions of the upper portions 110 of the fins 102 are used to form channel regions of the FinFET 200. Portions of the upper portions 110 of the fins 102 that are not covered by the stack structures 112 are referred to as exposed portions 118 hereinafter. The extending direction of the stack structure 112 is perpendicular to the extending direction of the fin 102. In some embodiments, light-doped regions 116 are formed on the exposed portions 118 of the fins 102, and the light-doped regions 116 are formed by performing an ion implantation.

Figure 2D:
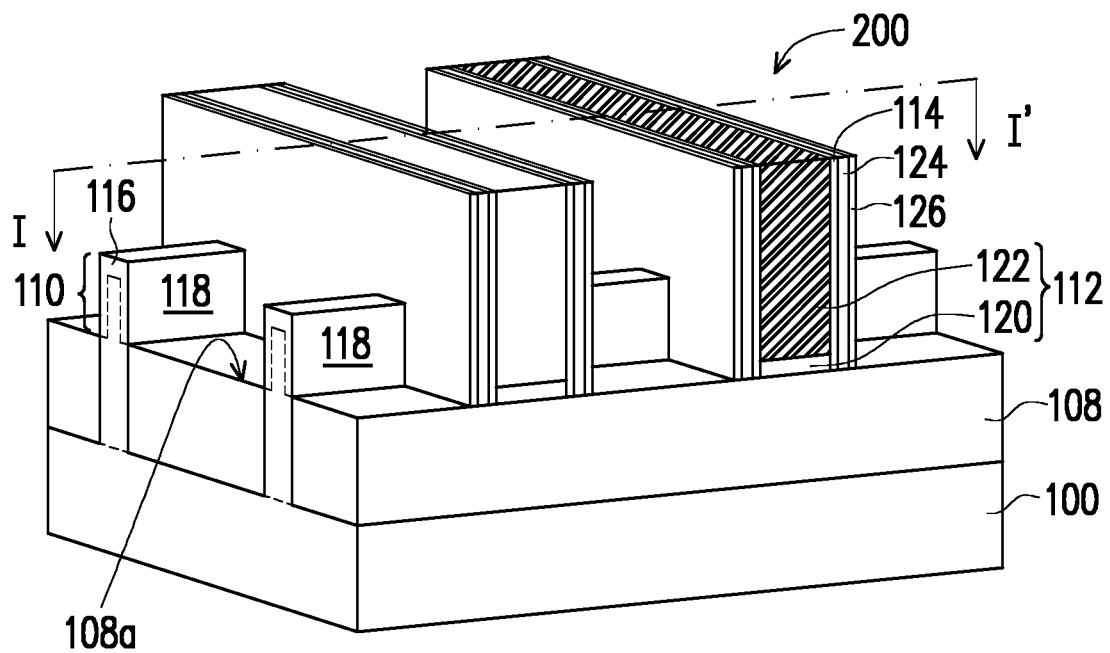
Figure 3D:
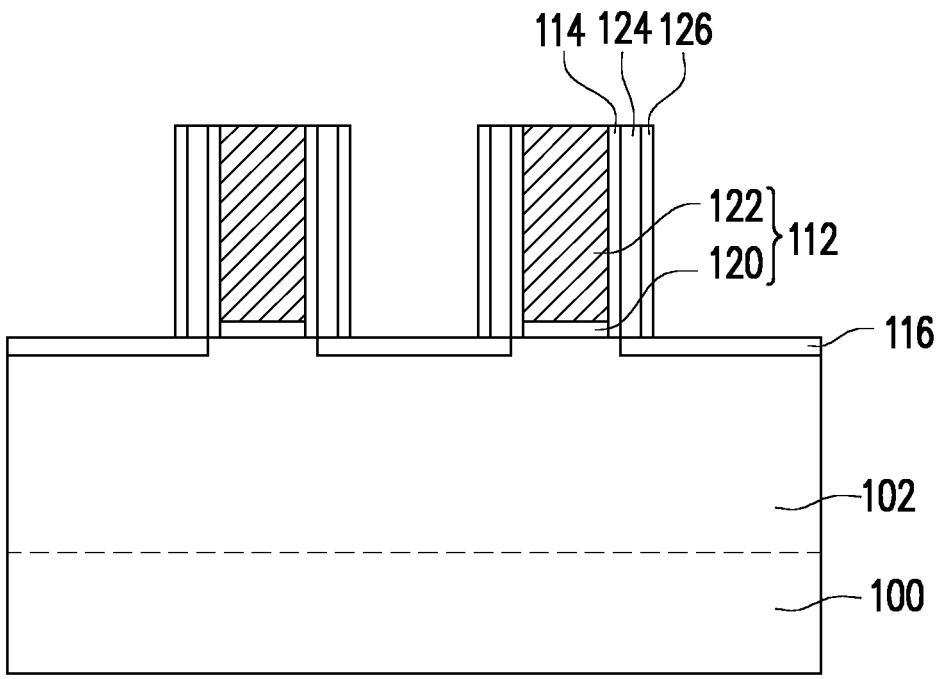

FIG. 2D is a perspective view of the FinFET 200 at one of various stages of the manufacturing method, and FIG. 3D is a cross-sectional view of the FinFET 200 taken along the line I-I' of FIG. 2D. In Step 18, a first offset spacer 124 is formed over the seal spacer 114. In some embodiments, the first offset spacer 124 is formed of dielectric materials, such as SiCON, SiOF, SiCO or a combination thereof. In some embodiments, the first offset spacer 124 has a thickness of 2-6 nm over the seal spacer 114 and has a dielectric constant of 3-5. In some embodiments, the first offset spacer 124 is formed by depositing a blanket layer of a dielectric material by atomic layer deposition and performing an anisotropic etching process to form the first offset spacer 124 over the seal spacer 114. In some embodiments, the first offset spacer 124 is formed of SiCON to maintain lowest K to maintain gate to source and drain capacitance.

In Step 20, a dummy spacer 126 is formed over the first offset spacer 124. In some embodiments, the dummy spacer 126 is formed of dielectric materials, such as silicon SiCN, SiCON or a combination thereof. In some embodiments, the dummy spacer 126 has a thickness of 2-6 nm over the first offset spacer 124 and has a dielectric constant of 5-7. In some embodiments, the dummy spacer 126 is formed by depositing a blanket layer of a dielectric material by atomic layer deposition and performing an anisotropic etching process to form the dummy spacer 126 over the first offset spacer 124. In some embodiments, the dummy spacer 126 is formed of SiCN with a carbon concentration of 0.5-2 at % to help retain the dummy spacer 126 (1-2 nm at gate to fin bottom corner) robustness during the subsequent etching process and with a dielectric constant of 5-7 while preventing carbon residue induced abnormal epitaxy during SiGe source drain (SD) etching.

In some embodiments, the dummy spacer 126 and the first offset spacer 124 are formed by depositing two blanket layers of a dielectric material by atomic layer deposition and performing an anisotropic etching process to form the dummy spacer 126 and the first offset spacer 124.

Figure 2E:
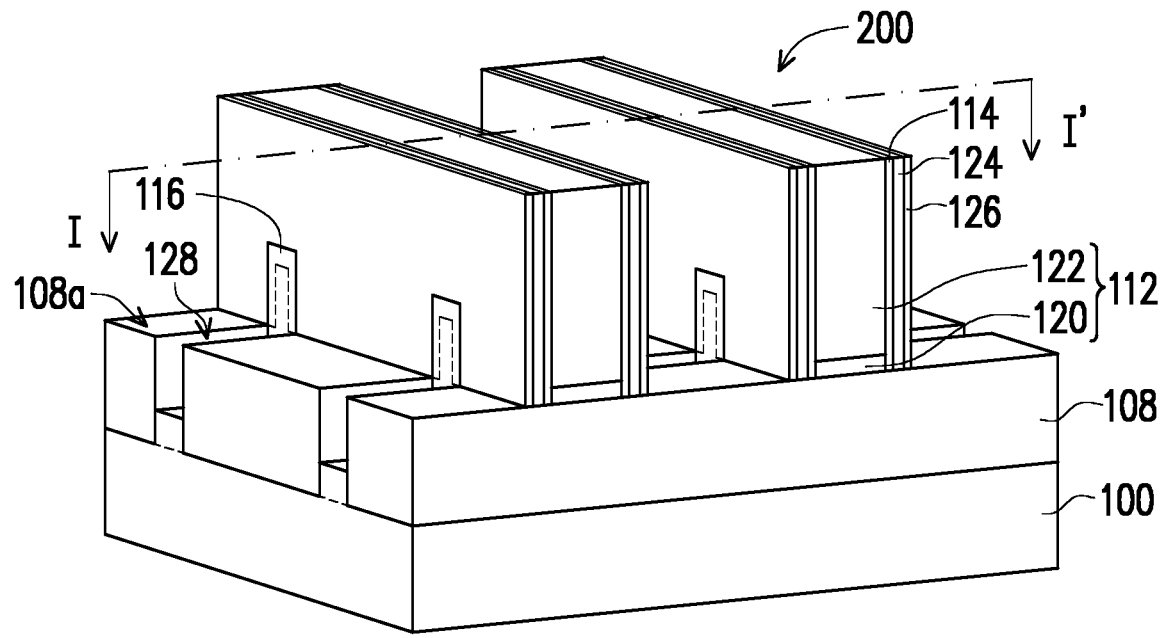
Figure 2I:
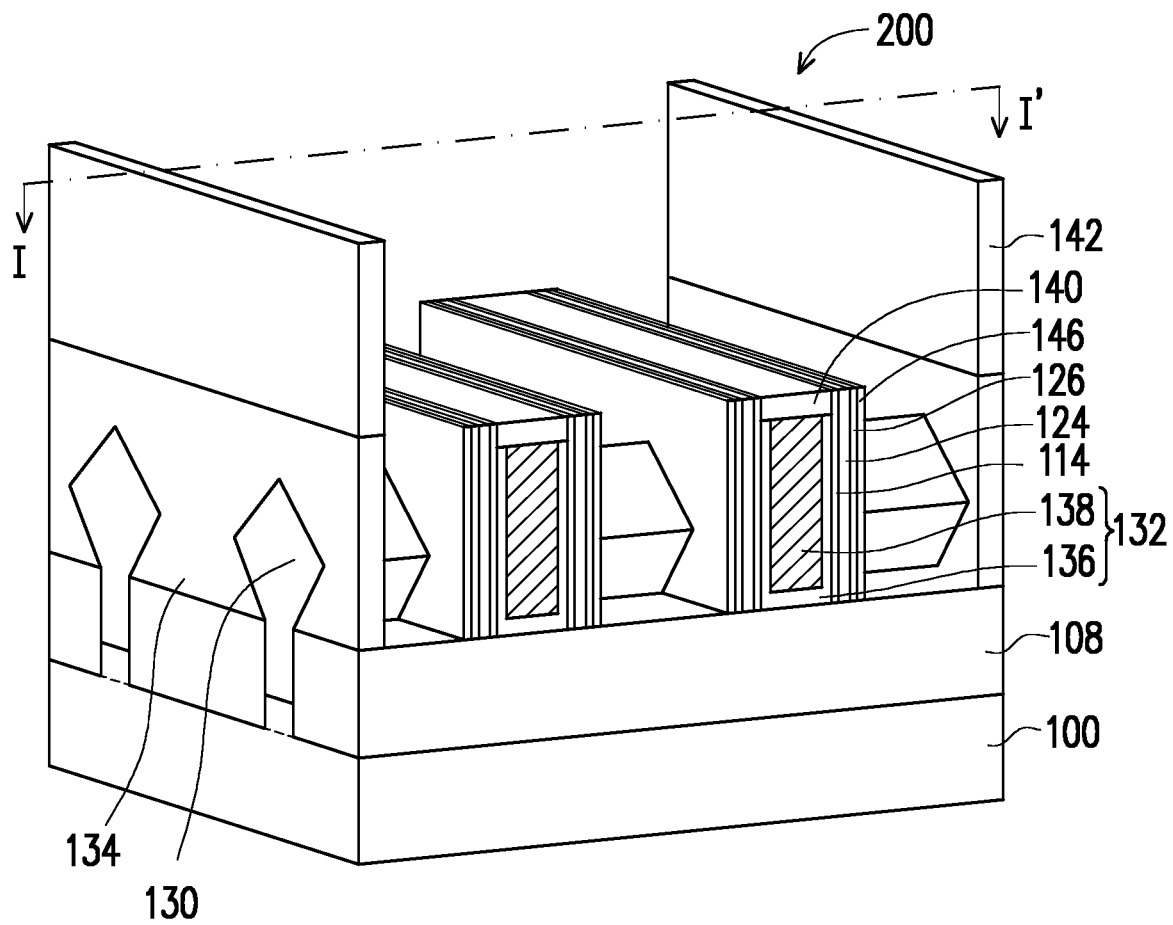
Figure 3E:
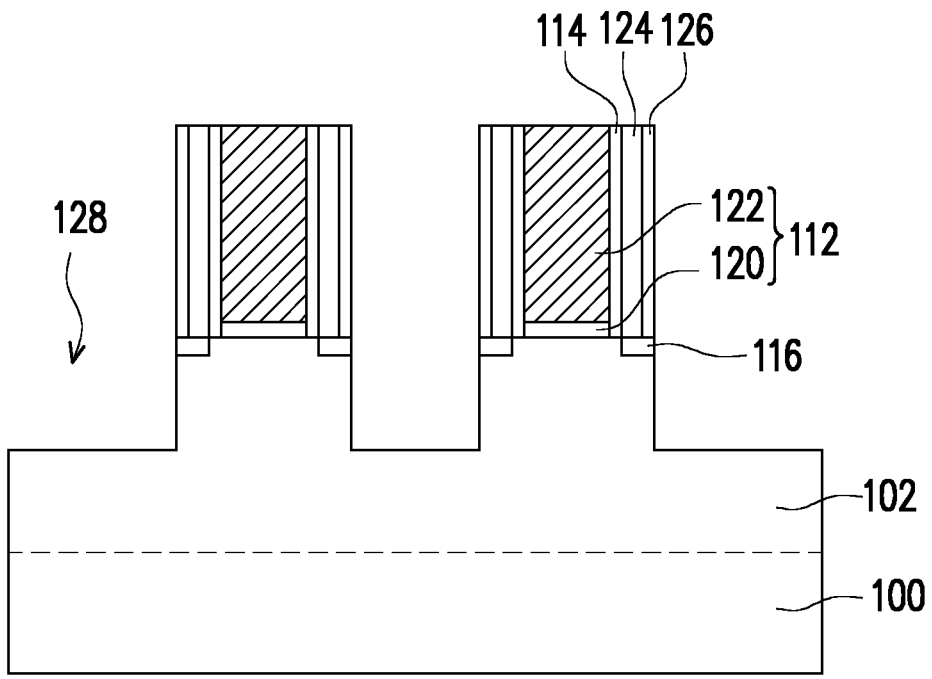
Figure 5:
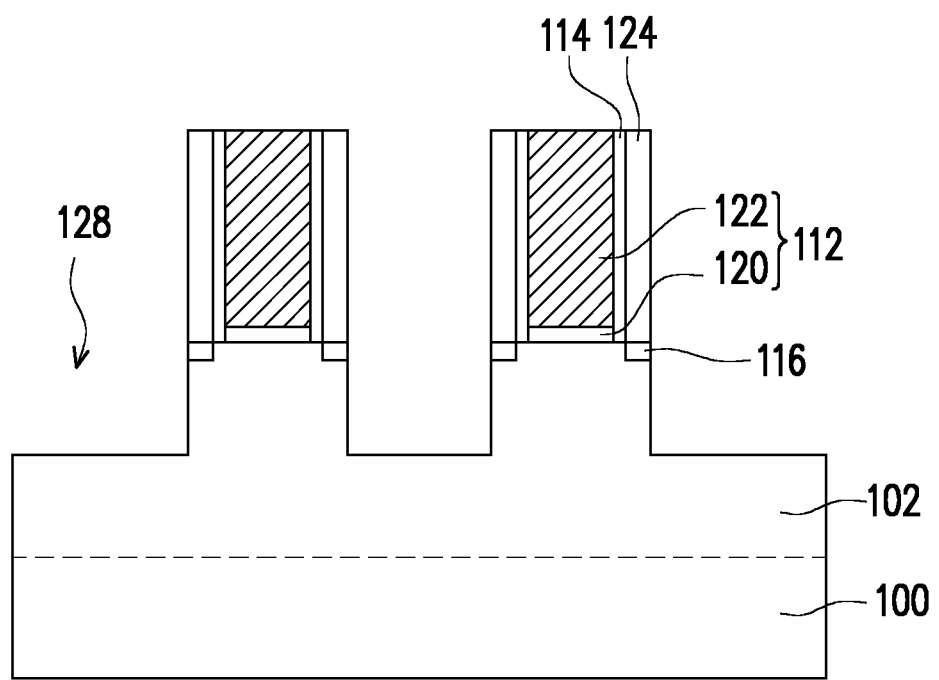
FIG. 5 is a cross-sectional view showing the FinFET at one of the various stages of the manufacturing method according to some alternative embodiments of the present disclosure.

FIG. 2E is a perspective view of the FinFET 200 at one of various stages of the manufacturing method, and FIG. 3E is a cross-sectional view of the FinFET 200 taken along the line I-I' of FIG. 2E. FIG. 5 is a cross-sectional view showing the FinFET at one of the various stages of the manufacturing method according to some alternative embodiments of the present disclosure. In Step 22, recesses 128 are formed in the fins 102 by removing portions of the fins 102 that are not covered by the stack structure 112 (SD etching). In some embodiments, the exposed portions 118 (FIG. 2D) of the fins 102 are removed to form the recesses 128, for example, by using anisotropic etching, isotropic etching or a combination thereof. In some embodiments, the fins 102 are recessed below the top surfaces 108a of the insulators 108. In some embodiments, during the etching of the exposed portions 118 of the fins 102, a portion of the dummy spacer 126 remains. In some embodiments, as illustrated in FIG. 5, during the etching of the exposed portions 118 of the fins 102, the dummy spacer 126 is removed. Therefore, the subsequently formed second offset spacer 146 (shown in FIG. 2I and FIG. 3I) may be directly in contact with the first offset spacer 124.

Figure 2F:
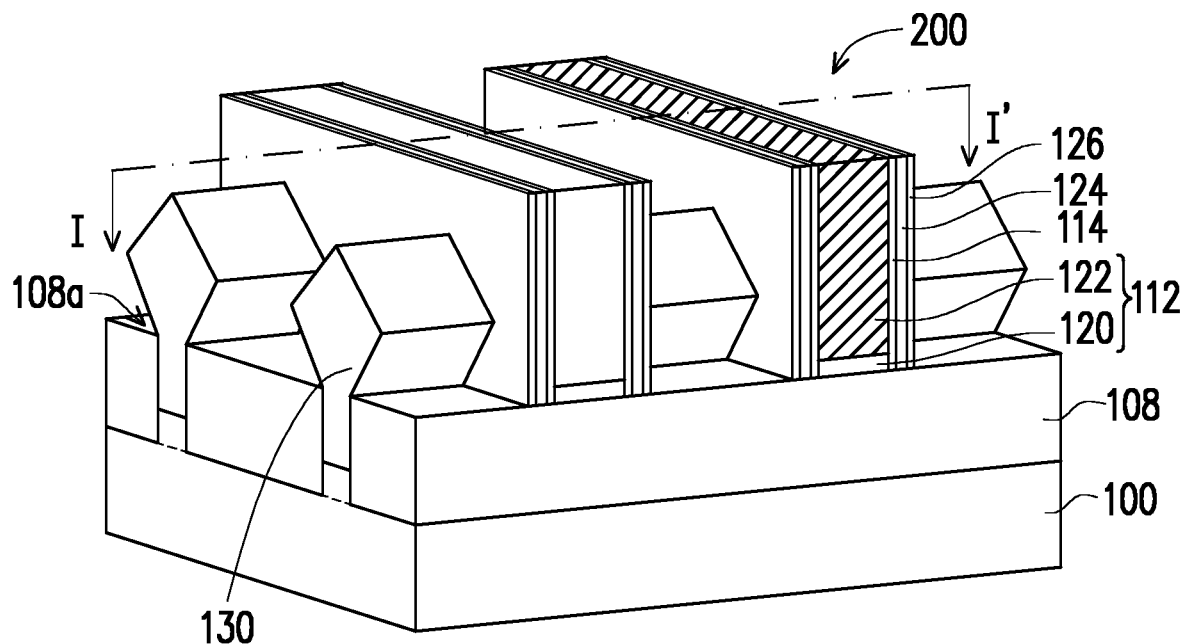
Figure 3F:
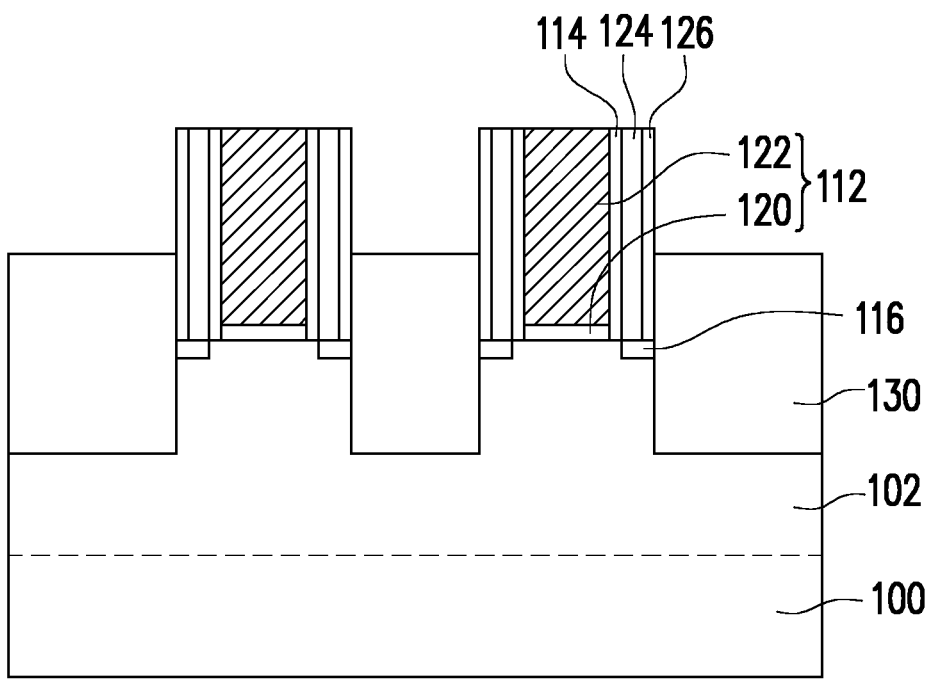

FIG. 2F is a perspective view of the FinFET 200 at one of various stages of the manufacturing method, and FIG. 3F is a cross-sectional view of the FinFET 200 taken along the line I-I' of FIG. 2F. In Step 24, strained material portions 130 are formed in the recesses 128 between the insulators 108 by filling a strained material (not shown) into the recesses 128. The strained material portions 130 are located on opposite sides of the stack structure 112. In some embodiments, the material of the strained material portions 130 includes SiGe, silicon carbon (SiC) or SiP, for example. In some embodiments, the strained material portions 130 are formed by selectively growing epitaxy. After the recesses 128 are filled with the strained material, further epitaxial growth of the strained material causes the strained material portions 130 to expand upward and horizontally beyond the recesses 128 and above the insulators 108. Since the lattice constant of the strained material is different from that of the material of the substrate 100, the channel region is strained or stressed to increase carrier mobility of the device and enhance the device performance. In some embodiments, some of the strained material portions 130 are formed with facets and the portions of the strained material portions 130 below the top surfaces 108a of the insulators 108 are referred as base portions. Then, the strained material portions 130 are implanted to form source and drain regions (labelled as 130 as well). The source and drain regions, also called strained source and drain regions, are located on opposite sides of the stack structure 112. In some embodiments, the source and drain regions 130 are optionally formed with silicide top layers (not shown) by silicidation.

Figure 2G:
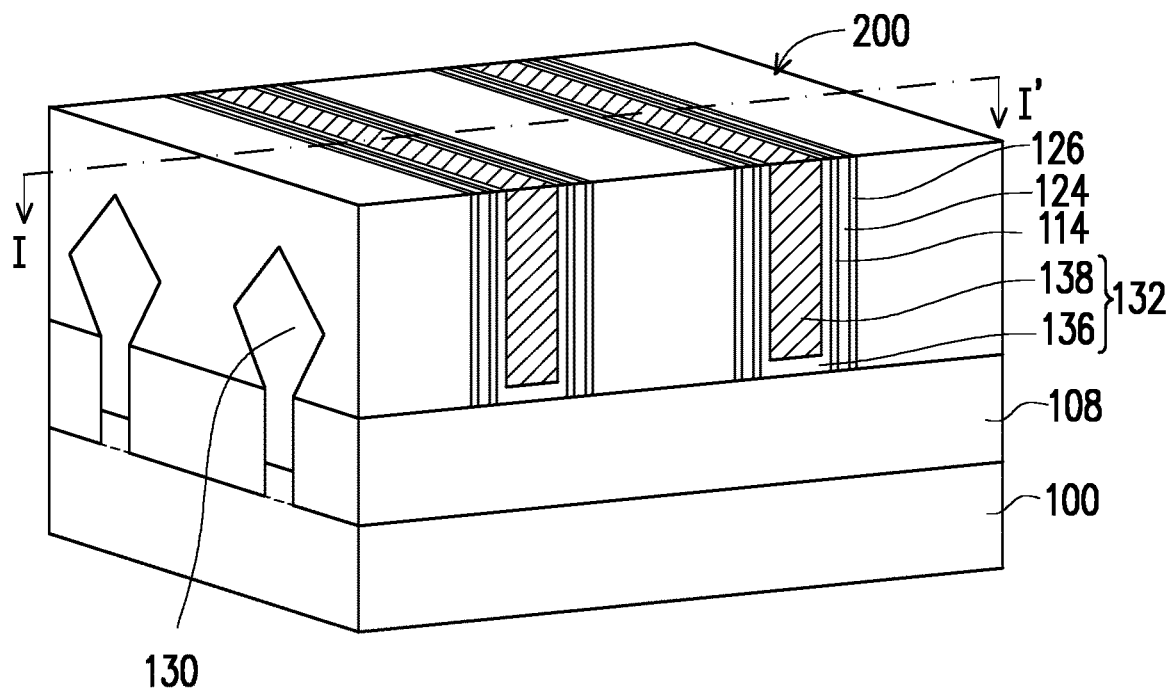
Figure 3G:
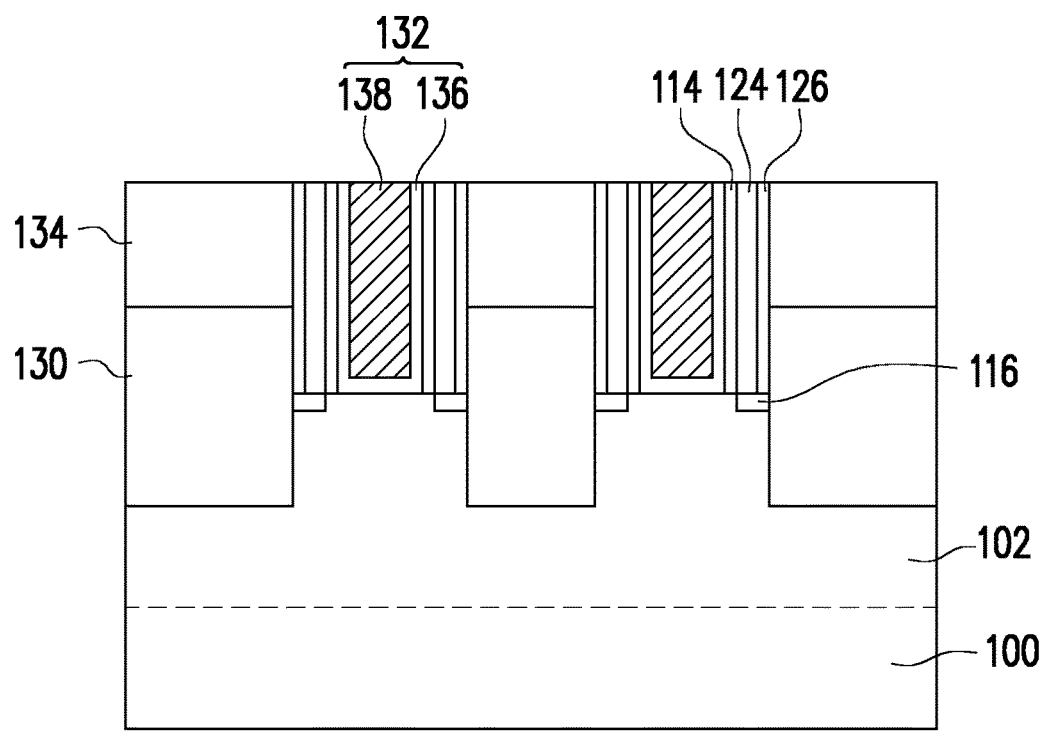

FIG. 2G is a perspective view of the FinFET 200 at one of various stages of the manufacturing method, and FIG. 3G is a cross-sectional view of the FinFET 200 taken along the line I-I' of FIG. 2G. In Step 26, a gate stack 132 is formed after the stack structure 112 is removed. An inter-layer dielectric layer 134 is formed over the stack structure 112. In some embodiments, the inter-layer dielectric layer 134 includes carbon-containing oxides, silicate glass, or a suitable dielectric material. In some embodiments, the inter-layer dielectric layer 134 is made of a single material. In alternative embodiments, the inter-layer dielectric layer 134 includes a multi-layer structure. The inter-layer dielectric layer 134 may be filled until its top surface is higher than the top surface of the stack structure 112. A planarization step such as CMP is then performed to remove excess of the inter-layer dielectric layer 134. In some embodiments, the stack structure 112 is used as a polish stop layer, so that the top surface of the inter-layer dielectric layer 134 is substantially level with the top surface of stack structure 112. In some embodiments, the dielectric layer 120 and the poly-silicon strips 122 located over the dielectric layer 120 are removed by anisotropic etching and the seal spacers 114, the first offset spacer 124 and the dummy spacer 126 remain.

Then, a gate dielectric layer 136 is formed in the recesses between the seal spacers 114 and over the top surfaces and the sidewalls of the fins 102. In some embodiments, the material of the gate dielectric layer 136 includes silicon oxide, silicon nitride or a combination thereof. In some embodiments, the gate dielectric layer 136 includes a high-k dielectric material, and the high-k dielectric material has a k value greater than 7.0 and includes a metal oxide or a silicate of Hf, Al, Zr, La, Mg, Ba, Ti, Pb and a combination thereof. In some embodiments, the gate dielectric layer 136 is formed by ALD, molecular beam deposition (MBD), physical vapor deposition (PVD) or thermal oxidation. Then, a gate electrode layer 138 is formed over the gate dielectric layer 136, over the covered portions (the channel regions) and fills the remaining recesses between the seal spacers 114. In some embodiments, the gate electrode layer 138 includes a metal-containing material, such as Al, Cu, W, Co, Ti, Ta, Ru, TiN, TiAl, TiAlN, TaN, TaC, NiSi, CoSi or a combination thereof. The materials of the gate dielectric layer 136 and/or the gate electrode layer 138 are chosen depending on whether the FinFET 200 is a p-type FinFET or an n-type FinFET. Optionally, a CMP process is performed to remove the excess of the gate dielectric layer 136 and the gate electrode layer 138. The seal spacers 114, the first offset spacers 124 and the dummy spacers 126 are located over sidewalls of the gate dielectric layer 136 and the gate electrode layer 138. That is, the stack structures 112 are replaced and the replacement gate stacks 132 are formed. In some embodiments described herein, the gate stacks 132 are replacement gates, but the gate stack structures or the fabrication processes thereof are not limited by these embodiments.

In some embodiments, the gate stacks 132 are located over the insulators 108 and the source and drain regions (strained material portions 130) are located on two opposite sides of the gate stacks 132. The gate stack 132 covers the channel regions of the fins 102, and the resultant FinFET 200 includes a plurality of fins.

Figure 2H:
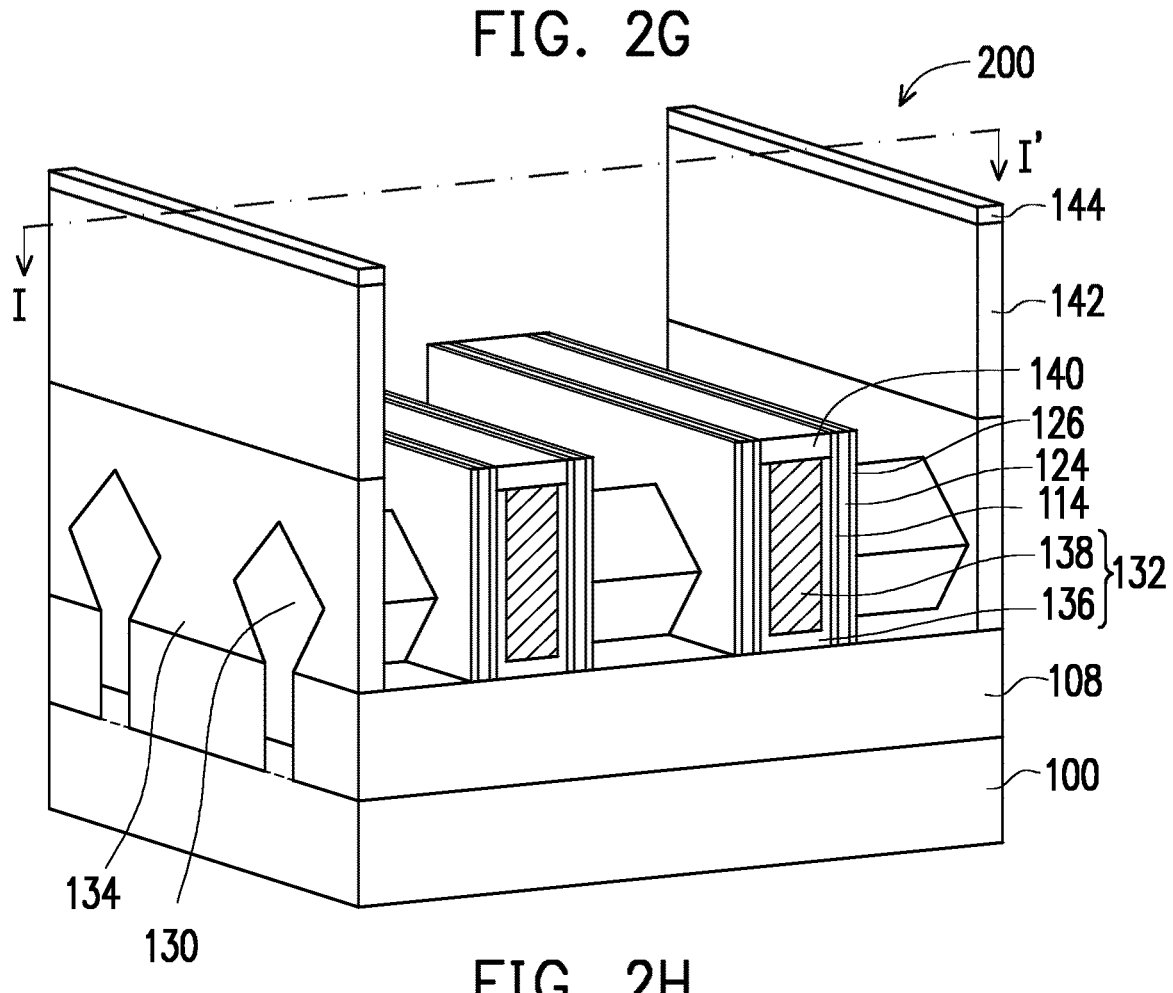
Figure 3H:
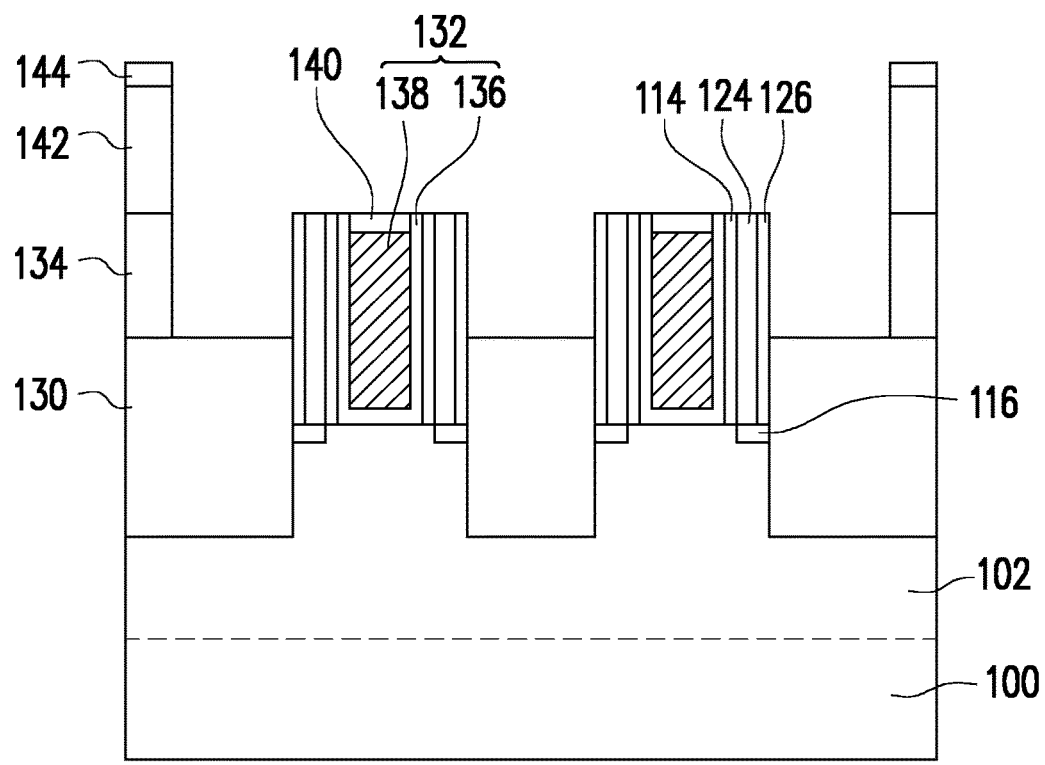

FIG. 2H is a perspective view of the FinFET 200 at one of various stages of the manufacturing method, and FIG. 3H is a cross-sectional view of the FinFET 200 taken along the line I-I' of FIG. 2G. In Step 28, a self-aligned contact process is performed. A portion of the gate electrode layer 138 is removed to form a recess in the gate electrode layer 138. In some embodiments, a portion of the gate electrode layer 138 is removed by anisotropic etching, isotropic etching or a combination thereof. A cap layer 140 is formed to fill the recess. The cap layer 140 is formed of silicon nitride, silicon oxide or a combination thereof, for example. In some embodiments, the cap layer 140 may be filled until its top surface is higher than the top surface of the inter-layer dielectric layer 134. A planarization step such as CMP is then performed to remove excess of the cap layer 140.

An inter-layer dielectric layer 142 is formed over the inter-layer dielectric layer 134. In some embodiments, the inter-layer dielectric layer 142 includes carbon-containing oxides, silicate glass, or a suitable dielectric material. In some embodiments, the inter-layer dielectric layer 142 is made of a single material. In alternative embodiments, the inter-layer dielectric layer 142 includes a multi-layer structure. Then, a hard mask layer 144 is formed over the inter-layer dielectric layer 142. In some embodiments, the hard mask layer 144 is a titanium nitride layer formed by, for example, physical vapor deposition (PVD). Then, the hard mask layer 144 is patterned. The inter-layer dielectric layer 142 and the inter-layer dielectric layer 134 are removed to expose the gate stack 132, the seal spacer 114, the first offset spacer 124, the dummy spacer 126 and a portion of the strained material portions 130 by using the patterned hard mask layer 144 as etching masks.

Figure 3I:
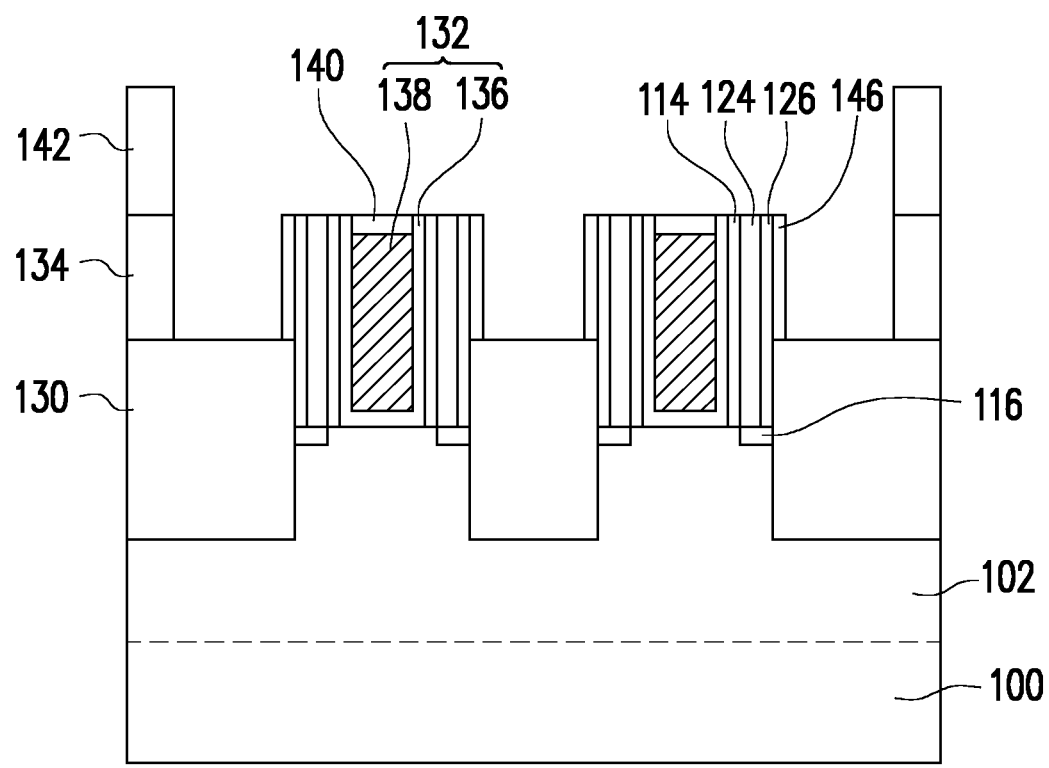

FIG. 2I is a perspective view of the FinFET 200 at one of various stages of the manufacturing method, and FIG. 3I is a cross-sectional view of the FinFET 200 taken along the line I-I' of FIG. 2I. The patterned hard mask layer 144 is removed by a wet etching process or a dry etching process, for example. In Step 30, a second offset spacer 146 is formed over the dummy spacer 126. In some embodiments, the second offset spacer 146 is formed of dielectric materials, such as silicon carbide nitride (SiCN), SiC, SiCON or a combination thereof. In some embodiments, the second offset spacer 146 has a thickness of 3-7 nm over the dummy spacer 126 and has a dielectric constant of 3-6. In some embodiments, the second offset spacer 146 is formed by depositing a blanket layer of a dielectric material by atomic layer deposition and performing an anisotropic etching process to form the second offset spacer 146 over the dummy spacer 126. In some embodiments, the dummy spacer 126 is removed during the etching of the exposed portions 118 of the fins 102, and the second offset spacer 146 is formed over the first offset spacer 124. In some embodiments, the second offset spacer 146 is formed to maintain a desired thickness to cope with the following etching that is performed to break the bottom portion on top of the fins 102 (EPI).

In Step 32, a treatment process is performed to passivate dangling bonds of the second offset spacer 146. In some embodiments, the treatment process includes in-situ forming-gas anneal or UV curing. In some embodiments, in-situ forming-gas anneal or UV curing is performed to passivate dangling bonds that are created during etch, which prevents oxide formation and therefore prevents loss induced by the pre-silicide native oxide removing process.

Figure 4A:
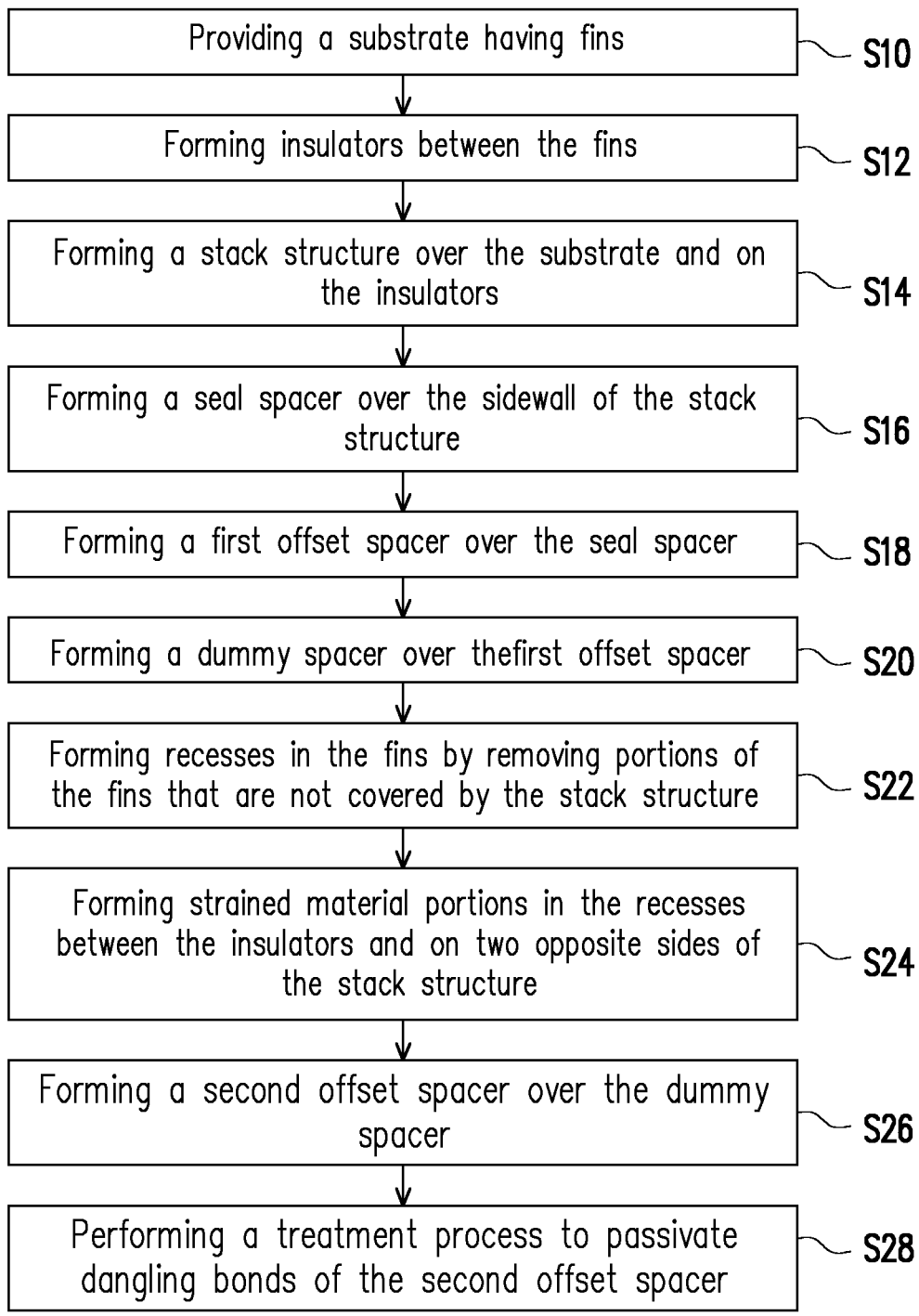
FIG. 4A is an exemplary flow chart showing the process steps of the manufacturing method for forming a FinFET in accordance with some embodiments of the present disclosure.
Figure 4B:
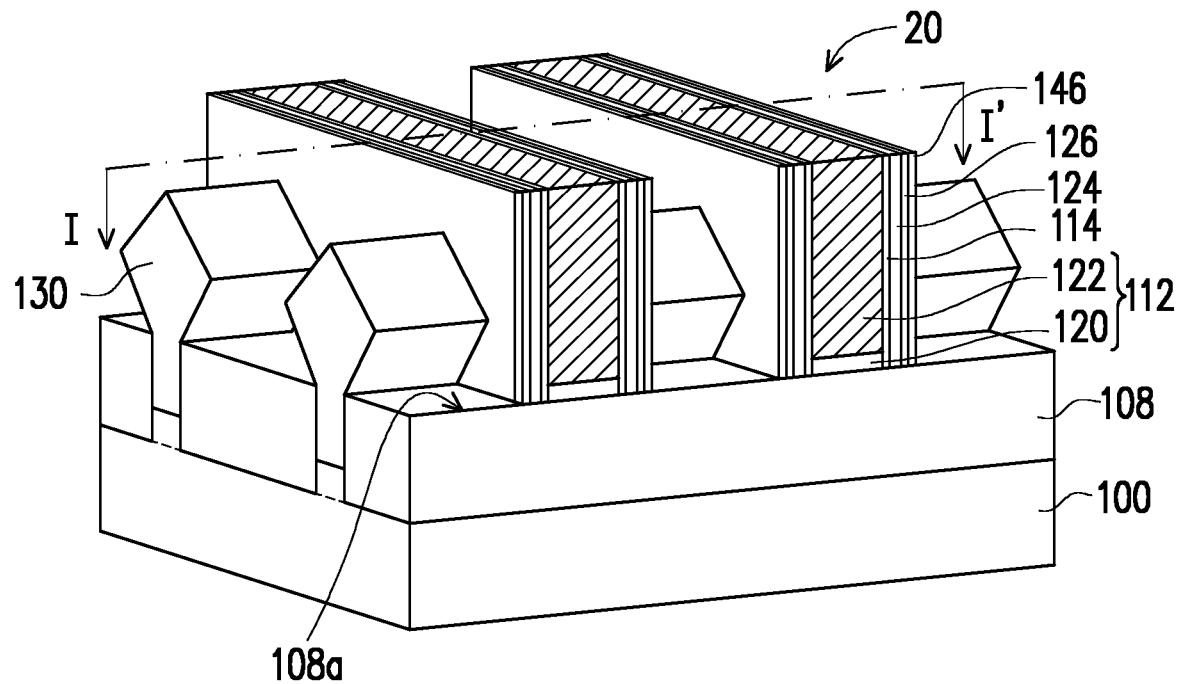
FIG. 4B is a perspective view showing the FinFET at various stages of the manufacturing method according to some embodiments of the present disclosure.
Figure 4C:
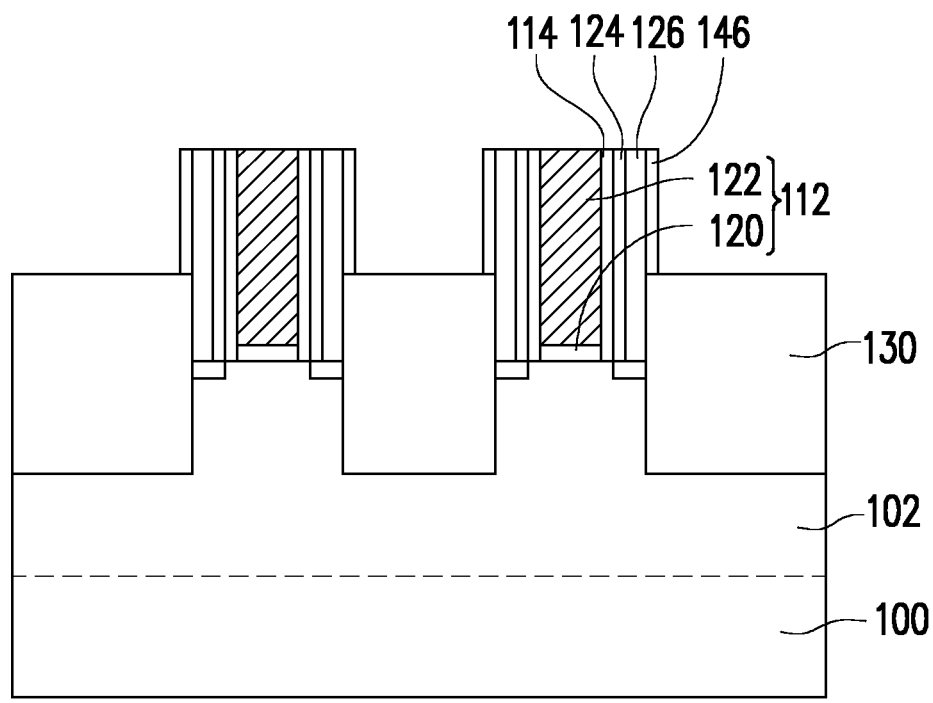
FIG. 4C is a cross-sectional view showing the FinFET at various stages of the manufacturing method according to some embodiments of the present disclosure.

In accordance with the embodiments, FIG. 4A is another exemplary flow chart showing the process steps of the manufacturing method for forming a FinFET. The various process steps of the process flow illustrated in FIG. 4A may include multiple process steps as discussed below. FIG. 4B is a perspective view showing the FinFET 200 at various stages of the manufacturing method for forming the FinFET according to some embodiments of the present disclosure. FIG. 4C is a cross-sectional view of the FinFET 200 taken along the line I-I' of FIG. 4B. It is to be noted that the process steps described herein cover a portion of the manufacturing processes used to fabricate a FinFET device. In FIG. 4A, the Steps 10-24 are the same as the Steps 10-24 of FIG. 1. FIG. 4B and FIG. 4C show processes following FIG. 2F and FIG. 3F respectively.

As shown in FIGS. 4A-4C, after the strained material portions 130 are formed in the recesses 128 between the insulators 108 by filling a strained material (not shown) into the recesses 128 (as shown in FIG. 2F and FIG. 3F).

In Step 26, the second offset spacer 146 is formed over the dummy spacer 126. In some embodiments, the second offset spacer 146 is formed of dielectric materials, such as silicon carbide nitride (SiCN), SiC or a combination thereof. In some embodiments, the second offset spacer 146 has a thickness of 3-7 nm over the dummy spacer 126 and has a dielectric constant of 3-6. In some embodiments, the second offset spacer 146 is formed by depositing a blanket layer of a dielectric material by atomic layer deposition and performing an anisotropic etching process to form the second offset spacer 146 over the seal spacer 114. In some embodiments, the dummy spacer 126 is removed during the etching of the exposed portions 118 of the fins 102, and the second offset spacer 146 is formed over the first offset spacer 124. In some embodiments, the second offset spacer 146 is formed to maintain a desired thickness to cope with the following etching that is performed to break the bottom portion on top of fin (EPI).

In Step 28, a treatment process is performed to passivate dangling bonds of the second offset spacer 146. In some embodiments, the treatment process includes in-situ forming-gas anneal or UV curing. In some embodiments, in-situ forming-gas anneal or UV curing is performed to passivate dangling bonds that are created during etch, which prevents oxide formation and therefore prevents loss induced by the pre-silicide native oxide removing process.

In the above embodiments, the seal spacer 114 is formed of SiCN with a carbon concentration of 1-12 at % to retain needed selectivity and a dielectric constant of 4-7, the first offset spacer 124 is formed of SiCON to maintain lowest K to maintain gate to source and drain capacitance, the dummy spacer 126 is formed of SiCN with a carbon concentration of 0.5-2 at % to help retain the dummy spacer (1-2 nm at gate to fin bottom corner) robustness during the subsequent etching process and with a dielectric constant of 5-7 while preventing carbon residue induced abnormal epitaxy during SiGe source drain (SD) etching, and the second offset spacer 146 is formed to maintain a desired thickness to cope with the following etching that is performed to break the bottom portion on top of fin (EPI). A treatment process includes in-situ forming-gas anneal or UV curing that is performed to passivate dangling bonds of the second offset spacer 146.

In some embodiments of the present disclosure, a fin-type field effect transistor including a substrate, insulators, a gate stack, a first spacer, a second spacer, a third spacer is described. The substrate has a plurality of fins thereon. The insulators are located over the substrate and between the fins. The gate stack is located over the fins and on the insulators. The first spacer is located over the sidewall of the gate stack. The second spacer is located over the first spacer. The first spacer and the second spacer includes carbon. The third spacer is located between the first spacer and the second spacer.

In some embodiments of the present disclosure, a fin-type field effect transistor including a substrate, insulators, a gate stack, a first spacer, a second spacer, a third spacer and a fourth spacer is described. The substrate has a plurality of fins thereon. The insulators are located over the substrate and between the fins. The gate stack is located over the fins and on the insulators. The first spacer is located over the sidewall of the gate stack, and a material of the first spacer includes SiCN with a carbon concentration of 1-12 at %. The second spacer is located over the first spacer. The third spacer is located over the second spacer and a material of the third spacer comprises SiCN with a carbon concentration of 0.5-2 at %. The fourth spacer is located over the third spacer.

In some embodiments of the present disclosure, a fin-type field effect transistor including a substrate, insulators, a gate stack, a multi-layered spacer, source/drain regions, and a first spacer is described. The substrate has a plurality of fins. The insulators are located over the substrate and between the fins. The gate stack is located over the fins and on the insulators. The multi-layered spacer is located over a sidewall of the gate stack. The source/drain regions are located on opposite sides of the gate stack. Top surfaces of the source/drain regions are protruded from top surfaces of the fins. The first spacer is located over the multi-layered spacer and is landed on the top surfaces of the source/drain regions.

In some embodiments of the present disclosure, a method for forming a fin-type field effect transistor is described. A substrate is provided. The substrate is patterned to form a plurality of fins. Insulators are formed between the fins. A stack structure is formed over the substrate and on the insulators, wherein the stack structure covers portions of the fins. A seal spacer is formed over the sidewall of the stack structure. A first offset spacer is formed over the seal spacer. A dummy spacer is formed over the first offset spacer. A plurality of recesses are formed in the fins by removing a plurality of portions of the fins that are not covered by the stack structure. A plurality of strained material portions are formed in the recesses between the insulators and on two opposite sides of the stack structure. A second offset spacer is formed over the dummy spacer. A treatment process is performed to passivate dangling bonds of the second offset spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-type field effect transistor, comprising:
a substrate having a plurality of fins;
a plurality of insulators, located over the substrate and between the fins;
a gate stack, located over the fins and on the insulators;
a first spacer, located over a sidewall of the gate stack;
a second spacer, located over the first spacer, wherein the first spacer and the second spacer comprise carbon, wherein along a stacking direction of the gate stack and the fins, the second spacer is overlapped with a respective fin of the fins; and
a third spacer, located between the first spacer and the second spacer, wherein a material of the third spacer comprises SiCON, SiCO or SiOF;
wherein a first surface of the first spacer and a first surface of the second spacer are substantially coplanar to each other and are further substantially levelled with a surface of the gate stack, and the surface of the gate stack is in contact with the plurality of insulators, and
wherein a second surface of the first spacer and a second surface of the second spacer are substantially coplanar to each other, the second surface of the first spacer is opposite to the first surface of the first spacer, and the second surface of the second spacer is opposite to the first surface of the second spacer.

2. The fin-type field effect transistor of claim 1, wherein a material of the first spacer has a dielectric constant of 4-7.

3. The fin-type field effect transistor of claim 1, wherein a material of the first spacer comprises SiCN.

4. The fin-type field effect transistor of claim 3, wherein the material of the first spacer has a carbon concentration of 1-12 at %.

5. The fin-type field effect transistor of claim 1, further comprising a fourth spacer located over the third spacer and having a dielectric constant of 3-6.

6. The fin-type field effect transistor of claim 5, wherein a material of the fourth spacer has a dangling bond concentration less than $1*10^{11}$ cm$^{-3}$.

7. The fin-type field effect transistor of claim 5, wherein a material of the fourth spacer comprises SiCN or SiC.

8. The fin-type field effect transistor of claim 5, wherein the second spacer has a dielectric constant of 5-7.

9. The fin-type field effect transistor of claim 1, wherein a material of the second spacer comprises SiCN.

10. The fin-type field effect transistor of claim 9, wherein the material of the second spacer has a carbon concentration of 0.5-2 at %.

11. A fin-type field effect transistor, comprising:
a substrate having a plurality of fins;
a plurality of insulators, located over the substrate and between the fins;
a gate stack, located over the fins and on the insulators;
a first spacer, located over a sidewall of the gate stack, wherein a material of the first spacer comprises SiCN;
a second spacer, located over the first spacer;
a third spacer, located over the second spacer, wherein a material of the third spacer comprises SiCN;
a fourth spacer, located over the third spacer; and
source/drain regions, located on opposite sides of the gate stack, the source/drain regions each having a sidewall in contact with and extending over a portion of a sidewall of the third spacer and coplanar with a sidewall of the fourth spacer at the sidewall of the third spacer,
wherein a surface of the first spacer and a surface of the third spacer are substantially coplanar to each other and are further substantially levelled with a surface of the gate stack, and the surface of the gate stack is in contact with the plurality of insulators, and
wherein the sidewall of the third spacer is connected to the surface of the third spacer, and an extending direction of the sidewall of the third spacer is perpendicular to an extending direction of the surface of the third spacer.

12. The fin-type field effect transistor of claim 11, wherein a material of the second spacer comprises SiCON, SiCO or SiOF.

13. The fin-type field effect transistor of claim 11, wherein a material of the fourth spacer has a dangling bond concentration less than $1*10^{11}$ cm$^{-3}$.

14. The fin-type field effect transistor of claim 11, wherein a material of the fourth spacer comprises SiCN or SiC.

15. A fin-type field effect transistor, comprising:
a substrate having a plurality of fins;
a plurality of insulators, located over the substrate and between the fins;
a gate stack, located over the fins and on the insulators;
a multi-layered spacer, located over a sidewall of the gate stack;
source/drain regions, located on opposite sides of the gate stack;
a first spacer, located over the multi-layered spacer and landed on the top surfaces of the source/drain regions, wherein the source/drain regions each have a sidewall in contact with and extending over a portion of a sidewall of the multi-layered spacer and coplanar with a sidewall of the first spacer at the sidewall of the multi-layered spacer; and
an inter-layer dielectric layer, located on the top surfaces of the source/drain regions and spaced apart from the first spacer, the multi-layered spacer and the gate stack, wherein a top surface of the inter-layer dielectric layer is substantially levelled with a top surface of the gate stack facing away from the plurality of insulators, and the first spacer is located between the inter-layer dielectric layer and the multi-layered spacer.

16. The fin-type field effect transistor of claim 15, wherein the multi-layered spacer comprises a second spacer, a third spacer, and a fourth spacer, and the third spacer is sandwiched between the second spacer and the fourth spacer.

17. The fin-type field effect transistor of claim 16, wherein a material of the second spacer and a material of the fourth spacer comprise SiCN.

18. The fin-type field effect transistor of claim 17, wherein the material of the second spacer has a carbon concentration of 1-12 at % and the material of the fourth spacer has a carbon concentration of 0.5-2 at %.

19. The fin-type field effect transistor of claim 15, wherein the multi-layered spacer comprises a second spacer and a third spacer, and the first spacer is directly in contact with the third spacer.

20. The fin-type field effect transistor of claim 17, wherein the material of the second spacer has a dielectric constant of 4-7 and the material of the fourth spacer has a dielectric constant of 5-7.

* * * * *